United States Patent [19]

Williams

[11] Patent Number: 4,761,570
[45] Date of Patent: Aug. 2, 1988

[54] PROGRAMMABLE LOGIC DEVICE WITH PROGRAMMABLE SIGNAL INHIBITION AND INVERSION MEANS

[75] Inventor: David G. Williams, Portland, Me.

[73] Assignee: Harris Corporation, Melbourne, Fla.

[21] Appl. No.: 13,851

[22] Filed: Feb. 12, 1987

[51] Int. Cl.⁴ ........................................... H03K 19/177
[52] U.S. Cl. ................................ 307/465; 307/202.1;
307/471; 307/262; 364/716
[58] Field of Search ...................... 307/202.1, 465–466,
307/468–469, 471, 236, 262; 340/825.84,
825.87; 364/716

[56] References Cited

U.S. PATENT DOCUMENTS

| | | | |
|---|---|---|---|
| 4,032,894 | 6/1977 | Williams | 364/716 X |
| 4,157,480 | 6/1979 | Edwards | 307/465 |
| 4,336,601 | 6/1982 | Tanaka | 364/716 X |
| 4,612,459 | 9/1986 | Pollachek | 307/465 X |
| 4,667,337 | 5/1987 | Fletcher | 307/471 X |
| 4,670,748 | 6/1987 | Williams | 340/825.52 X |

OTHER PUBLICATIONS

Varadarajan, "Universal Array Logic", *IBM T.D.B.*, vol. 20, No. 1, Jun. 1977, pp. 189–190.
Brickman et al., "Programmable Logic Array Logic Enhancement", *IBM T.D.B.*, vol. 19, No. 2, Jul. 1976, p. 583.

*Primary Examiner*—Stanley D. Miller
*Assistant Examiner*—D. R. Hudspeth
*Attorney, Agent, or Firm*—William A. Troner; Charles C. Krawczyk

[57] ABSTRACT

A programmable logic circuit which can be implemented on a single integrated circuit in conjunction with other associated circuitry. The circuit includes programmable fuses whereby the circuit can be programmed to implent AND, NAND, OR, or NOR functions. Additionally, the circuit can be programmed to accept either a high or low true logic on each individual input as well as providing either a high true or low true output.

19 Claims, 2 Drawing Sheets

PROGRAMMABLE LOGIC DEVICE WITH PROGRAMMABLE SIGNAL INHIBITION AND INVERSION MEANS

FIELD OF THE INVENTION

The subject invention relates generally to the field of programmable logic devices. More particularly, the present invention relates to a programmable circuit arrangement provided on a single integrated circuit which provides the capability of performing selected AND, NAND, OR and NOR functions. Additionally, the arrangement can be programmed to accept either a high or low true logic on each individual input as well as providing either a high true or low true output.

BACKGROUND

In the field of programmable logic devices, it is typical for an engineer designing logic for a particular application to provide, from a variety of available discrete logic components, a logic configuration capable of performing the required input translation from an output of a first logic device to an input of a second logic device. This translation function is necessary due to the variety of circuit applications which may require, among other things, either a high true or low true logic. Thus, in a situation where a plurality of outputs are provided from logic circuits, some of which include high true logic and some of which include low true logic, it has previously been necessary to design particular circuitry directed to translating all of the outputs to a single logic condition. Use of discrete logic components, however, has the disadvantage of slow speeds in the circuit's operation.

For instance, in a situation where six inputs are provided to a logic circuit, three of which inputs come from devices having high true logic and three of which inputs come from devices having low true logic, a design engineer may have initially selected an eight input NAND device such as a 7430 and utilized a 7404 hex inverter to implement the circuit arrangement. Since most of the propagation delay in an integrated circuit is incurred upon the entering and leaving of a chip, this approach requires three traverses of integrated circuits, and thus, includes a three-chip delay. Additionally, two logic devices are required in order to accomplish this relatively simple translation of the six inputs such that they can all be provided to a high true logic device.

Due to the complexity of designing some translation portions of a circuit from discrete components, design engineers have migrated to the use of complex programmable logic arrays (PLA). However, use of these complex arrays require substantial area on an integrated chip resulting in large power consumption and slower speeds of operation. These losses become even more pertinent when much of the array is not required by the specific application, thereby making use of these complex arrays inefficient, wasteful and costly.

Another disadvantageous feature of these programmable logic arrays is the incorporation of a programmable fuse in the AC path of the circuit. If the fuse is left intact such that the respective line is included in the array, the speed of the circuit's operation is further reduced by the presence of the fuse in the AC path.

It is, therefore, an object of the present invention to provide a new and improved programmable logic device.

It is another object of the present invention to provide a new and improved programmable circuit which is adapted for implementation on a single integrated circuit.

It is still another object of the present invention to provide a new and improved programmable integrated circuit which selectively provides an active low or active high for each input and output of the circuit.

It is a further object of the present invention to provide a new and improved integrated circuit which performs the programmed logic functions utilizing minimal space without wasting area unnecessarily for simple applications of logic.

It is further an object of the present invention to provide a new and improved integrated circuit which performs the programmed logic functions at an improved speed.

It is still further an object of the present invention to provide a new and improved integrated circuit which performs the programmed logic function using low power.

It is another object of the present invention to provide a new and improved programmable integrated circuit which eliminates the use of fuses or their equivalent in the logic AC path of the logic components.

In accordance with the invention, an input macro cell comprising a programmable logic circuit selectively controls input circuits to which the logic circuit is to be responsive as well as the polarity of the input circuit, such that when a selected pattern of input signals are received, an output signal is provided of a controllable polarity.

In accordance with another feature of the invention, a programmable means for controlling the polarity of the output signal to provide either a low true logic or a high true logic output signal.

A further feature of the invention is to combine in parallel a plurality of the above-mentioned input macro cell circuits and provide the respective outputs to an additional output macro cell comprising a programmable logic circuit which can selectively control which signals it is to receive from the respective input macro cells. Additionally, the output programmable logic circuit is programmable such that its output may be selectively inverted to accommodate high true or low true logic.

In a specific embodiment of the invention, an input macro cell (IMC) is provided which includes a multiple input AND gate. Coupled to each input of the AND gate are programmable OR gates which by way of blowing fuses at respective inputs of the OR gates can vary the width of the AND gate to a specific application. An exclusive OR gate is provided to an input of each each OR gate which by way of blowing fuses at respective inputs of the exclusive OR gates, provides for selectively programming the polarity of the logic signal each exclusive OR gate is to receive. Thus, each input to the multiple AND gate can be selectively inhibited as well as made low true logic or high true logic. Additionally, an exclusive OR gate may be provided at the output of the AND gate such that by way of a fuse, the output can be selectively programmed to be a low true or high true logic.

The invention, therefore, provides a programmable logic circuit which can be programmed to implement AND, OR, NAND, NOR, or inverting logic functions. This is accomplished by selectively programming the polarities of both the inputs and output. As noted above, the logical results of several IMC's can be used as inputs to an output macro cell (OMC) for the purpose of either increasing the number of variables on a given output function, thereby widening the gate or increasing the number of overall logic levels replaced.

In accordance with another embodiment of the invention, an OMC is provided which includes a multiple input NOR gate. At each input of the NOR gate is an equivalent to a NOR gate with a fuse incorporated in an input of each NOR gate. By way of blowing selected fuses, the width of the OMC can be varied, deselecting those inputs not required for the specific application. An exclusive OR gate is provided at the output of the multiple input NOR gate which by way of a fuse can be selectively programmed to provide a low true or high true logic output signal. As a result of combining a plurality of IMC's in combination with one or more OMC's, complex structures such as AND-OR-INVERT, can be realized. Because of the integrated nature of the above circuits, however, the loss of speed as with discrete logic components or the loss of power and area on die of the more complex programmable logic circuits are avoided.

Further objects, features, and advantages of the present invention will become more apparent from the following description when taken with the accompanying drawings which show, for purposes of illustration only, an embodiment in accordance with the present invention.

DETAILED DESCRIPTION OF THE DRAWINGS

Figure 1:
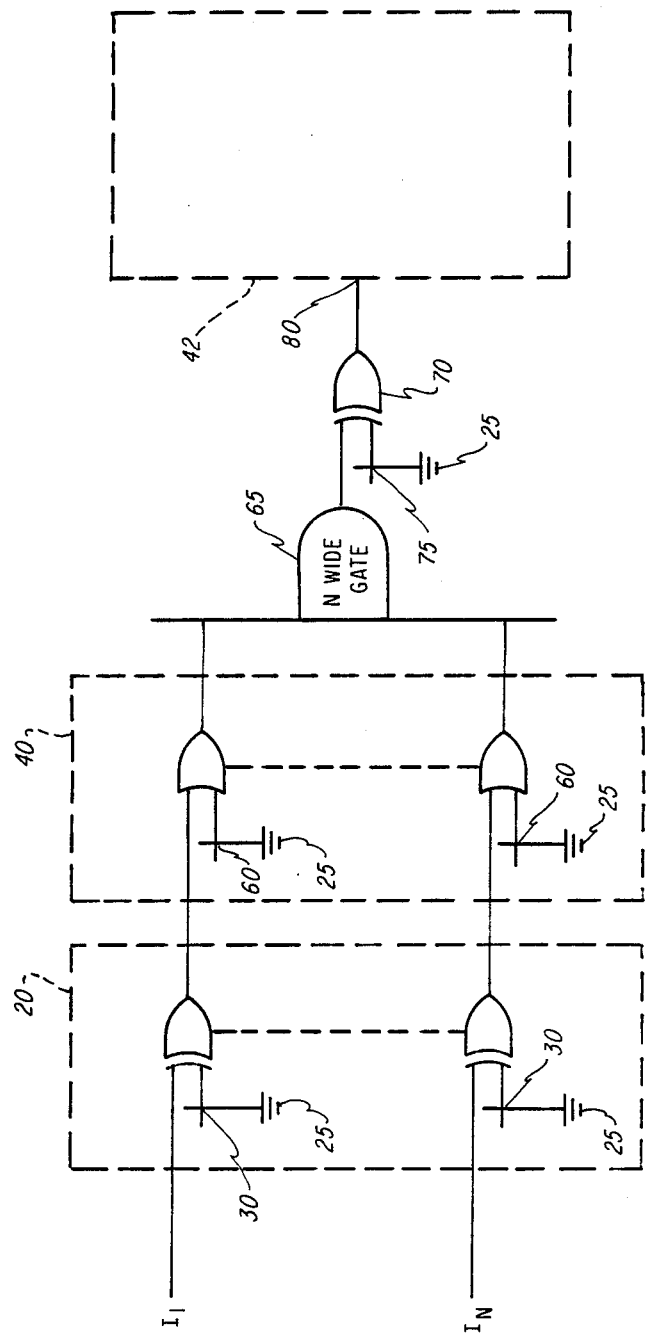
FIG. 1 is a schematic diagram of a preferred embodiment of an input macro cell.

Referring to FIG. 1, a preferred embodiment shows an input macro cell including a plurality of two input exclusive OR gates 20. One of the inputs of each exclusive OR gate is coupled to ground potential 25 via a fuse 30. The second of the two OR gate inputs is coupled to a source of logic data signals $I_1$ through $I_N$. The outputs of these exclusive OR gates are coupled to a respective one of two inputs of a plurality of OR gates 40. The second of the two inputs of each OR gate is coupled to a reference or ground potential 24 via a fuse 60. The outputs of the OR gates 40 are coupled to an input of a multiple input AND gate 65. The output of the AND gate 65 is coupled to one of two inputs of an exclusive OR gate 70. The second of the two inputs is connected to a ground potential 25 via a fuse 75.

The plurality of exclusive OR gates 20, provide the means for programming the polarity of the respective input. If the fuse 30 on the input line of the respective exclusive OR gate is conductive, the respective gate input is coupled statically to ground, thereby representing a "0" logic at that input. This results in the respective exclusive OR gate providing the same logic at its output as that received at its second input. If the fuse 30 is non-conductive, the corresponding input line will be a logic "1", thereby producing the inversion of the received input logic signal at the output of the respective gate.

The plurality of the OR gates 40, provide the means for selectively inhibiting the respective input line. When the fuse 60 is conductive on a respective OR gate, the respective input is grounded thus representing a "0" logic. This results in the respective OR gate passing through the logic received from the respective exclusive OR gate. If the fuse 60 is non-conductive, the respective input is a logic "1", thereby substituting a logic "1" at the respective OR gate output independent of the logic signal received at its second input. This, in effect, results in inhibiting the respective input line.

The exclusive OR gates 70 which are provided at the AND gate output, provides the means for programming the polarity of the output signal. Similar to the programming of the plurality of exclusive OR gates 20, if the fuse 75 of the exclusive OR gate is conductive, the effect of the gate will be to output the same logic as is received at its second input, thereby providing a high true logic output. If the fuse is non-conductive, the output logic will be inverted, and thus provide a true low logic output.

The combination of these programmable gates coupled with the AND gate 65 provide the capability of programming the input macro cell to implement an AND, OR, NAND or NOR operation on the input logic data signals. This is because the AND gate 65 in combination of the exclusive OR gates provide a logic means which reflect the logical output of the function being performed. Thus, the signal is representative of the interrelationship of the data signals. Additionally, if all but one of the inputs is deselected, the IMC can be a simple inverter.

To further illustrate the implementation of the different logic operations, the following explanation is provided. If all the fuses of the IMC are left intact, the circuit becomes an N-wide AND gate. If the fuses 75 in the respective exclusive OR gates 70 are rendered non-conductive, the output 80 is inverted, and the IMC performs a NAND operation. If only the fuses of the input exclusive OR gates 20 are rendered non-conductive, then the IMC performs a NOR operation. If in addition to the fuses 30 of the input exclusive OR gates being rendered non-conductive, the fuse 75 of the output exclusive OR gate 70 is also non-conductive, the IMC performs an OR operation.

Variations of the above are possible by allowing the appropriate fuses to be non-conductive. Also, certain inputs requiring true low and other inputs requiring true high can be easily accommodated by providing non-conductive fuses 30 of the respective exclusive OR gates 75 which are to receive the true low.

Figure 2:
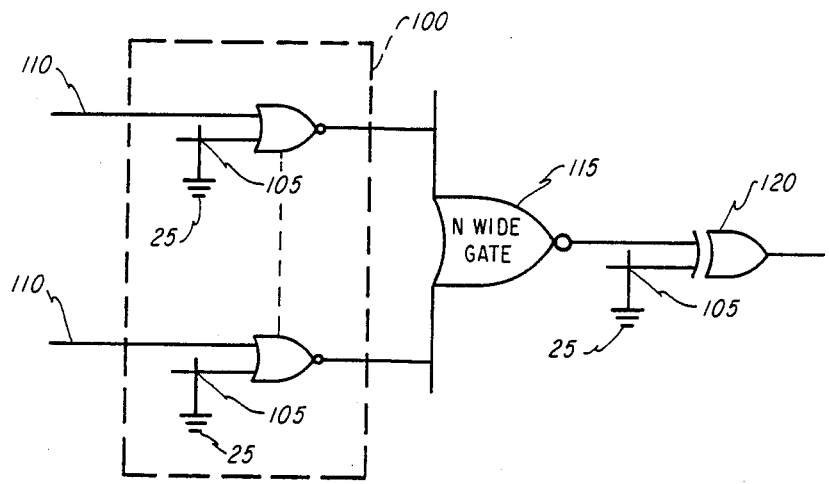
FIG. 2 is a schematic diagram of a preferred embodiment of an output macro cell.

When additional logic levels are required or an expanded AND is preferred, a plurality of IMC's can be provided to an output macro cell (OMC) shown in FIG. 2. The OMC includes a plurality of NOR gates 100, each having one input coupled to a ground potential 25 via a fuse 105. A second input 110 to the NOR gates 100 is coupled to respective outputs 80 of the several IMC's. The outputs of the NOR gates 100 are coupled to the respective inputs of an N-wide NOR gate 115. The output of the NOR gate 115 is coupled to one of two inputs of an exclusive OR gate 120. The other input to the gate 120 is coupled to ground potential 25 via a fuse 125.

The OMC can be programmed to deselect any of its inputs as well as selectively invert the output of the logic signal from the NOR gate 115. The NOR gates 100 provide the means for selecting or deselecting the respective IMC signal. The output exclusive OR 120 provides the means for selectively inverting the output signal. The combination of components in the OMC result in providing an OR or NOR operation.

As with the IMC, the signal at the output of the NOR gates 100 reflects the logic output of the function being performed. Thus, this signal is representative of the interrelationship of the logic signals.

Figure 3:
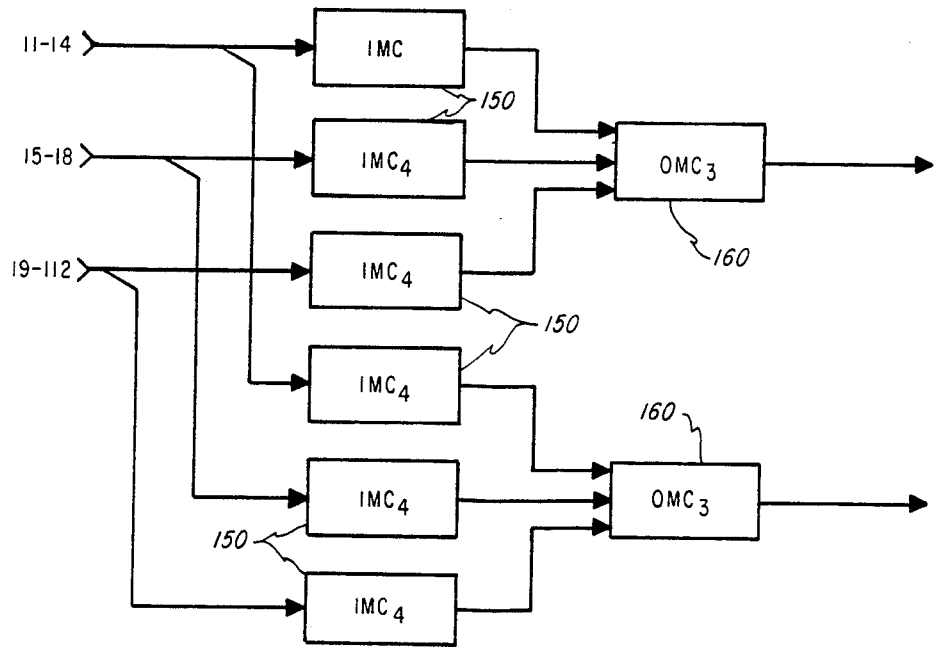
FIG. 3 is a block diagram illustrating by way of an example a combination of several input macro cells and output macro cells.

FIG. 3 shows a specific implementation of six IMC's 150 coupled to a pair of OMC's 160. This arrangement of the macro cells allows for the implementation of a unique logic arrangement.

The fuses of either IMC or OMC can be ohmic fuses which can be blown in conventional manners such as as by raising the $V_c$ to activate internal programming for blowing designated fuses. While it is anticipated that conventional fuses which are conductive prior to being blown will be used, it would be equally satisfactory to use any programmable element, including vertical fuses of the type which are non-conductive prior to being programmed and which are rendered conductive for instance by a silicide forming step. In terms of this application, the term "blowing" a fuse is to be interpreted as meaning rendering a programmable element non-conductive.

For purposes of fuse programming, it is not necessarily required that the fuses 30 are programmable by the same voltages as fuses 60, although in most cases this would be a practical manner of implementing the invention. An example where a different programming voltage would be desirable for fuse 30 as opposed to fuse 60 in each leg of the programmable means would be a situation where, for instance, a high voltage would cause fuse 30 to blow while a high negative voltage would cause fuse 60 to blow and in this case provide an option of using a single fusing input for providing selective fusing of fuse 30 as opposed to fuse 60.

As may be appreciated from the above, the present invention is suitable for implementation on a single integrated circuit chip in conjunction with other associated circuitry on the same integrated circuit such as in the fabrication of products using a standard cell approach. FIG. 1 illustrates the other associated circuitry in dashed line 42. This provides a speed advantage with respect to a non-single integrated circuit implementation due to the savings in speed accompanying the elimination of the input/output circuitry required between the input macro cell for instance, and the other associated circuitry. By providing the input macro cell on the same integrated circuit as the other circuitry, total system design may be accomplished with a minimum of board space due to the reduction in the number of integrated circuits required, for the elimination of discrete components on the board. An additional advantage of applicant's invention is the reduction in space required on the integrated circuit for implementing the logic functions provided in accordance with the invention. The highly efficient architecture and organization of the logic elements provided in accordance with the invention results in a substantial space savings relative to prior manners of implementing logic which may have the features described herein. For instance, in a prior application where a fuse array is utilized to provide the logic levels and logic functions provided in accordance with the invention, it was necessary to provide the entire fuse array and then to program the fuse array for the purpose of providing the logic functions.

By dedicating the logic functions and providing programmability, the circuit path required is much shorter due to the absence of long conductive paths provided in fuse array, hence, faster circuit operation is obtainable. Additionally, as explained herein before, the fusing elements are not in the logic path, thus, further speeding circuit operation.

Although the present invention has been described and illustrated in detail, it is to be clearly understood that the same is by way of illustration and example only, and is not to be taken by way of limitation. For instance, specific types of gates are designated in the preferred embodiments, any equivalent of the respective gate logic can be substituted. The spirit and scope of the present invention are to be limited only by the terms of the appended claims.

What is claimed is:

1. A programmable logic circuit comprising:
   a first programmable means for selectively controlling the inhibition and inversion of logic signals applied to various input circuits,
   logic circuit means coupled to said first programmable means for receiving said controlled signals from said first programmable means, wherein said logic circuit means provides an output signal having a preset relationship with respect to said controlled signals received from said first programmable means, and
   a second programmable means for receiving said output signal of said logic circuit for selectively inverting said output signal of said logic circuit means.

2. A programmable logic circuit comprising:
   a first programmable means for selectively controlling the inhibition and inversion of logic signals applied to various input circuits,
   logic circuit means coupled to said first programmable means for receiving said controlled signals from said first programmable means, wherein said logic circuit means provides an output signal having a preset relationship with respect to said controlled signals received from said first programmable means,
   wherein said first programmable means includes multiple exclusive OR gates, each gate having a first input programmably coupled to a voltage potential via a programmable element, a second input for receiving said logic signals, and an output coupled to said logic circuit means, wherein said logic signal which is transmitted to a respective second input of an exclusive OR gate will be inverted at said gate output if said corresponding programmable element of said gate is nonconductive, and
   wherein said first programmable means further includes multiple OR logic gates, each OR gate having a first input programmably coupled to a voltage potential via a programmable element and a second input coupled to said output of one of said exclusive OR logic gates, wherein an output of said OR gates is coupled to said logic means, said logic signal being inhibited at an output of said OR gate if said corresponding programmable element of said respective OR gate is nonconductive.

3. The logic circuit of claim 2, wherein said logic circuit means includes an AND gate having multiple inputs and an output, said inputs of said AND gate are connected to respective outputs of said OR gates.

4. The logic circuit of claim 3, further including a second programmable means comprising an exclusive OR gate having a first input programmably coupled to a voltage potential via a programmable element and a second input coupled to said output of said logic circuit means, wherein said logic signal is provided to said OR gate from said logic circuit means and is selectively inverted if said programmable element of said exclusive OR gate is nonconductive.

5. An integrated circuit including:
programmable means having a plurality of inputs and an output, said inputs receive data signals, wherein said programmable means further includes a selection means for selectively transmitting said data signals in inverted form, said programmable means further including a means for selectively inhibiting said inputs received from said selection means, wherein said programmable means implements selected logic functions on said received data signals and provides a logic signal at said output, wherein said selection and inhibiting means include programmable element means for selectively inverting and inhibiting, respectively, said data signals which are not selectively inhibited pass through said selection means and inhibiting means without traversing said programmable element means.

6. The integrated circuit of claim 5, wherein said selection means includes a plurality of exclusive OR gates, each having a first input programmably coupled to a voltage potential, a second input coupled to an input of said programmable means, and an output coupled to said inhibiting means.

7. The integrated circuit of claim 6, wherein said inhibiting means includes a plurality of OR gates, each having a first input programmably coupled to a voltage potential, a second input coupled to said output of said exclusive OR gates and an output.

8. The integrated circuit of claim 7, wherein said programmable means further includes an AND gate having multiple inputs and an output, said inputs being coupled to respective outputs of said OR gates.

9. A programmable logic circuit having a plurality of circuit inputs for receiving data signals and a circuit output, said programmable logic circuit comprising:
programmable input means having a plurality of inputs coupled to said plurality of circuit inputs and a plurality of outputs, wherein said programmable input means provides for selectively inhibiting said inputs and selectively changing the state of each output, and
logic means having a plurality of inputs coupled to said plurality of outputs of said programmable input means and an output coupled to said circuit output for providing an output logic signal at said circuit output according to a predetermined logic relationship between said data signals received from said programmable input means.

10. A programmable logic circuit having a plurality of input lines for receiving data signals and an output line, said programmable logic circuit comprising:
programmable input means having a plurality of inputs and a plurality of outputs, said inputs being coupled to said plurality of input lines for receiving said data signals from said input lines, said programmable input means including means for selectively inverting said data signals, and means for selectively inhibiting said data signals;
logic means having a plurality of inputs coupled to said outputs of said programmable input means for receiving said data signals and an output coupled to said output line for providing an output logic signal on said output line according to a relationship with said data signals received from said programmable input means, and
programmable output means coupled between said output of said logic circuit means and said output line for selectively inverting said output logic signal.

11. A programmable logic circuit having a plurality of input lines for receiving data signals and an output line for providing a logic signal as a logic function of said data signals received, said programmable logic circuit comprising:
a plurality of input stages, each input stage including:
a first programmable input means coupled to said input lines for selectively inhibiting any number of said input lines and selectively inverting said data signals;
a first logic means coupled to said first programmable input means for receiving said data signals and providing an output logic signal representative of the interrelationship of said data signals;
a first programmable output means coupled to said first logic means for selectively inverting said output logic signal and providing same to an output of said input stage; and
at least one output stage including:
a second programmable input means coupled to said outputs of said plurality of input stages for selectively inhibiting any number of said outputs;
a second logic means coupled to said second programmable input means for receiving said output logic signals from said second programmable input means and providing a second output logic signal representative of the interrelationship of said output logic signals; and
a second programmable output means coupled between said second logic means and said output line of said logic circuit for selectively inverting said output logic signal.

12. A programmable logic circuit comprising:
at least two programmable input stages, each having a first programmable number of input means for receiving data signals and at least one output means, wherein said input stage implements a first predetermined logic function on said data signals and provides the resulting logic signal at said output means, wherein each of said input means includes a first means for selectively inverting said logic signal applied thereto, and
a programmable output stage having a second programmable number of input means coupled to said output means of said input stages for receiving a selected number of said logic signals from said input stages, said output stage implementing a second predetermined logic function on said logic signals.

13. The logic circuit of claim 12, wherein said output means of said programmable input stage includes a second means for selectively inverting said logic signal at said output means.

14. The logic circuit of claim 12, wherein said programmable output stage further includes an output means for selectively inverting said logic signal.

15. An integrated circuit having a plurality of circuit inputs for receiving data signals and a circuit output, said circuit including:
- a plurality of exclusive OR gates, each having a first and a second input and an output, said first input being programmably coupled to a voltage potential and said second input being coupled to a corresponding circuit input for receiving data signals, wherein the output of the respective exclusive OR gate may be selectively inverted;
- a plurality of OR gates, each having a first and a second input and an output, said first input being programmably coupled to a voltage potential and said second input being coupled to a corresponding one of said exclusive OR gate outputs wherein said OR gates may be selectively inhibited, and
- an AND gate having multiple inputs and an output, wherein said inputs are coupled to said outputs of said OR gates and said output is coupled to said circuit output.

16. The integrated circuit of claim 15, further including an exclusive OR gate having a first and a second input and an output, said first input being programmably coupled to a voltage potential and said second input being coupled to said AND gate output and said output coupled to said circuit output, wherein said output of said exclusive OR gate may be selectively inverted.

17. An integrated circuit having a plurality of circuit inputs and a circuit output including:
- a plurality of NOR gates, each having a first input programmably coupled to a first voltage potential and a second input coupled to one of said plurality of circuit inputs, wherein said first input may be inhibited, and
- an additional NOR gate having multiple inputs coupled to respective outputs of said NOR gates, and an output coupled to said circuit output.

18. The integrated circuit of claim 17, further comprising an exclusive OR gate having a first and a second input and an output, said first input being programmably coupled to said first voltage potential and said second input being coupled to said output of said additional NOR gate, wherein said output of said exclusive OR gate may be selectively inverted.

19. Method of programming data signals comprising:
receiving concurrent independent data signals;
selecting at least a plurality of said independent data signals;
independently controlling a logic true value of each of said data signals;
providing an output signal in accordance with a predetermined logic relationship of said data signals; and
independently controlling a logic true value of said output signal.

* * * * *